United States Patent
Elbe et al.

(10) Patent No.: US 6,999,337 B2
(45) Date of Patent: Feb. 14, 2006

(54) REGISTER CELL AND METHOD FOR WRITING TO THE REGISTER CELL

(75) Inventors: Astrid Elbe, Munich (DE); Wieland Fischer, Munich (DE); Norbert Janssen, Munich (DE); Tanja Roemer, Munich (DE); Holger Sedlak, Sauerlach (DE); Jean-Pierre Seifert, Munich (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/934,301

(22) Filed: Sep. 3, 2004

(65) Prior Publication Data

US 2005/0073346 A1 Apr. 7, 2005

Related U.S. Application Data

(63) Continuation of application No. PCT/EP03/02755, filed on Mar. 17, 2003.

(30) Foreign Application Priority Data

Mar. 25, 2002 (DE) ................................ 102 13 267

(51) Int. Cl.
*G11C 11/00* (2006.01)
(52) U.S. Cl. ........................................ 365/154; 365/156
(58) Field of Classification Search ................ 365/154, 365/156, 189.12, 189.05
See application file for complete search history.

(56) References Cited

U.S. PATENT DOCUMENTS

| | | | |
|---|---|---|---|
| 4,916,333 A | | 4/1990 | Kowalski |
| 5,177,706 A | | 1/1993 | Shinohara et al. |
| 5,453,950 A | | 9/1995 | Voss et al. |
| 5,525,923 A | * | 6/1996 | Bialas et al. ................ 327/210 |
| 5,966,320 A | | 10/1999 | Hsu |

FOREIGN PATENT DOCUMENTS

| | | |
|---|---|---|
| DE | 43 26 822 C2 | 3/1994 |
| DE | 199 36 890 A1 | 4/2000 |
| EP | 1 026 695 A1 | 8/2000 |

* cited by examiner

*Primary Examiner*—Son T. Dinh
(74) *Attorney, Agent, or Firm*—Darby & Darby

(57) ABSTRACT

A register cell includes a first input for a data unit to be written into the register cell. The register cell includes further a second input for a negated data unit to be written into the register cell. A first pair of oppositely coupled inverters as a first storage circuit is adapted to be coupled to the first input. A second pair of oppositely coupled inverters as a second storage circuit is adapted to be coupled to a second input. Using two oppositely coupled pairs of inverters makes it possible to initialize both the first input and the second input of the register either to a high voltage state (precharge) or to a low voltage state (discharge), such that the power consumption of the register cell is homogenized from one working clock to the next.

12 Claims, 2 Drawing Sheets

| DATA | DATA |
|---|---|
| 0 | 1 |
| 0 | 1 |
| 1 | 0 |
| 0 | 1 |

REGISTER CELL AND METHOD FOR WRITING TO THE REGISTER CELL

CROSS-REFERENCE TO RELATED APPLICATION

This application is a continuation of copending International Application No. PCT/EP03/02755, filed Mar. 17, 2003, which designated the United States and was not published in English, and is incorporated herein by reference in its entirety.

BACKGROUND OF THE INVENTION

1. Field of the Invention

The present invention relates to the data storage, and, in particular, to the safe storing of data in a register.

2. Description of Prior Art

FIG. 2 shows a latch-storage cell of a register. For example, a 32-bit-latch includes 32 storage cells of the form, as is in principle represented in FIG. 2. A latch-storage cell includes a first inverter 200 and a second inverter 210, which are oppositely connected, such that the output of e.g. the upper inverter 200 is fed into the input of the lower inverter 210. Thus, as is shown in FIG. 2, both inverters are coupled by a first linking point 212a, which connects the output of an inverter to the input of the other inverter, and by a second linking point 212b, which links the input of the one inverter 200 to the output of the other inverter 210. The two oppositely coupled inverters 200, 210 are connected between a data line 214 and a line 216 for negated data, with switches 218a and 218b being provided between the data lines 214 and 216 and the respective linking points 212a, 212b. The two switches 218a and 218b are controllable by a control line 212, to close the switches 218a, 218b when the storage cell is to be read out or to be written to, and to open the switches 218a, 218b when nothing is to happen to latch-storage cell, i.e. if it is neither to be read from nor to be written to.

Both inverters 200, 210 each have supply terminals $V_{cc}$ and mass terminals GND, to supply the transistors from which the inverters are built from. In principle, the inverter structure of FIG. 2 is a feedback circuit in that, if, for example, on the right side, referring to FIG. 2, a "1" is applied, on the left side, a "0" is generated, while, considering the opposite case, i.e. the case, which is designated with brackets in FIG. 2, logically opposite states are held. Charge losses within the inverters are compensated for by the supply voltage $V_{cc}$ such that, if a supply voltage is applied, either the "0" or the "1" is held. In the "Hold"-condition, both switches 218a, 218b are open, such that no connection to the line data 214 or to the line non-data 216 is present.

Should the inverter be read out, for example, using the line "data" 214, a driver circuit (not shown in FIG. 2) for the line 214 is deactivated. Further, the switch 218a is closed, such that the two inverters 200, 210 so to say drive the data line 214 with their respective condition. Alternatively or simultaneously, the same may be carried out with the driver circuit for the line 216 and/or with the switch 218b for the "negative"-side of the latch-storage.

If, in contrast, data are to be written to the register cell shown in FIG. 2, a distinction is to be made between two cases. In general, when writing into a storage cell shown in FIG. 2, typically both switches 218a, 218b are closed using the control line 220. Moreover, the line drivers for the lines 214 and 216 are activated to drive the lines 214 and/or 216, while, as has been explained, when reading from the storage cell the lines are not driven, but the storage cells themselves act as line drivers.

In the first case, in which data are written into the storage cell and in which the data to be written into the storage cell are the same as are held in a storage cell, nothing will happen to the storage cell. This case is represented in the first lines of the table from FIG. 3.

In the second case, the data content is changed by a write operation to the storage cell. If, for example, on the left side of the two inverters 200, 210 from FIG. 2, there was a "0", and a "1" is to be written into, the condition of the storage cell has to be changed. For this purpose, the left side of the two inverters is drawn into a logic "1" state via the data line 214, while the right side of the two inverters 200, 210 is drawn into the logic "0" state by the data-non-line 216, as also becomes evident from a comparison of the second and third line of FIG. 3.

If then, in a condition succeeding in time, the storage cell is again written into and the content of the storage cell is changed again, the same will happen, but with a different polarity.

As has been explained, the condition of the storage cell does not change, if the same value which has previously been in the storage cell is written into the storage cell. If, however, the value of the storage cell is changed, the conditions in the storage cell will change as well. Typically, use is made of CMOS-circuits. In CMOS-circuits, typically no current consumption takes place in a non-changing condition, while a noticeable current consumption occurs, if the CMOS-circuit has to carry out a change of condition.

If the storage cell shown in FIG. 2 is provided for storing sensitive data, for example, for storing secret keys in the RSA algorithm or any other cryptoalgorithm, an attacker, if he monitors the current consumption of the line driver circuit for driving the lines 214 and 216 from FIG. 2 or if he monitors the $V_{cc}$ terminals of the inverters 200, 210, might extract the secret information already by means of the power profile and from working clock information, as to whether the condition of the storage cell had changed or not. Assuming it is not possible for the attacker to monitor one single storage cell, this might be more likely to be possible if a common supply terminal for a register with many storage cells, such as e.g. 8, 16, 32, or 64 storage cells or also, thinking of long number arithmetic-logic units for cryptographic applications, 2304 storage cells, is provided.

As has already been explained, a storage cell requires current and/or power, when it changes its condition, whereas it does not need any current, if its condition remains unchanged. Applying this consideration to a whole register with several storage cells results in the following. Assuming, for example, that a register with 16 storage cells was initialized to "0" at the beginning, and now a number is loaded into the register, which has 16 bits, with 10 bit being a "1", and with the remaining 6 bit representing a "0", such condition changes will occur in 10 of the 16 storage cells of this register. At the power supply terminal, therefore, a power peak with a certain height will be recognizable, which depends on how many bits have changed from "0" to "1". In the present example, the power peak will have a height equal to ten times of a unity power peak incurring if one single storage cell has changed regarding its condition. The number of bits in a number is also referred as hamming weight (a) of the number a.

Solely on the basis of the power consumption when writing to a register, an attacker may obtain an indication of the difference of the hamming weight of the previous register content and of the hamming weight of the new register content. Thus, in order to monitor the register-writing in a usually "unpermitted" manner, an attacker has to possess the hamming weight of the first number in order to then recognize by means of a power analysis the difference of the hamming weights of successive storage values. Typically, at the beginning, registers are initialized to a 0 state, i.e. the register cell is at 0, so that the first power analysis immediately provides the hamming weight of the first number. Depending on the application, the hamming weight of a secret number is of more or less use to the attacker. Yet, especially for highly safe applications, such as SmartCards for cash cards, personal identity cards, etc., it is undesirable to have any information about secret numbers, such as the hamming weight of the secret number, leak out, since, as a result, safety risks might arise, the extent of which is not yet known.

Further, a disadvantage of the known storage cell, as is represented in FIG. 2, is the fact, as has already been explained and discussed by means of FIG. 3, that a power consumption occurs during a data change in the register cell, i.e. if the previous value in the register is overwritten by a new one, since both inverters from FIG. 2 change their condition, while, if no data change occurs in the register cell, i.e. if the same value is "written" as a new value into the register cell, no power consumption, i. e. a significantly lower power consumption occurs. An attacker is thus able to recognize whether a data change in the register cell has taken place or not. This results in a safety leakage for the register cell, which is especially disadvantageous, if the register cell is provided for storing sensitive data, such as a bit of a secret key.

SUMMARY OF THE INVENTION

It is an object of the present invention to provide a safe register cell or a safe method for writing to the register cell.

In accordance with a first aspect, the present invention provides a register cell, having a first input for a data unit to be written into the register cell; a second input for a negated data unit to be written into the register cell; a first storage circuit which is adapted to be coupled to the first input; a second storage circuit which is adapted to be coupled to the second input; and an initializator configured to control the register cell such that the first storage circuit and the second storage circuit are initialized to the same logic state.

In accordance with a second aspect, the present invention provides a method for writing to a register cell having a first input for a data unit to be written into the register cell, a second input for a negated data unit to be written into the register cell, a first storage circuit, which is adapted to be coupled to the first input, and a second storage circuit, which is adapted to be coupled to the second input, the method having the steps of: initializing the first storage circuit and the second storage circuit to the same state; writing the data unit via the first input to the first storage circuit; and writing the negated data unit via the second input to the second storage circuit.

The present invention is based on the idea that the power consumption of the register cell has to be homogenized, i.e. that the same power consumption incurs, independent of whether the condition of the register cell is changed or not. In accordance with the invention, this will be achieved in that the number of a register cell's storage circuits, which are, for example, built from inverters, is doubled, such that an inventive register cell comprises two storage circuits, such as, for example, two pairs of oppositely coupled inverters, with the input of the register cell for a data unit being adapted to be coupled to the first storage circuit, for example, to the first pair of the oppositely coupled inverters, while the input for the negated data of the register cell is adapted to be coupled to the second storage circuit, for example, to the second pair of oppositely coupled inverters.

The coupling of the two inputs to the line for the data unit and to the line for the negated data unit takes place by means of two controllable switches, which are closed when there is a read from the register cell or there is a write to the register cell, and which are open when the register cell is neither subjected to a read action nor to a write action, but is only to hold the stored value.

The inventive structure makes it possible to initialize both the line for the data unit and the line for the negated data unit on the same logic state, wherein this initialization may either consist of a precharge or of a discharge. Making use of a precharge initialization, both data lines are initialized to a high voltage state, while, if use is made of a discharge initialization, both lines are initialized to a low voltage state. Since each "useful condition" of the register cell consists in that the input for the data has a condition and that the input for the negated data has a condition inverse to the one condition,—independent of whether a "1" or "0" is written into the register cell—an inverter pair always has to change its condition such that the power consumption of the register cell for a precharge, a discharge or a write is always the same. An attacker may therefore not recognize, whether the condition of the register cell, in general, has changed or not from one write to the next.

BRIEF DESCRIPTION OF THE DRAWINGS

These and other objects and features of the present invention will become clear from the following description taken in conjunction with the accompanying drawings, in which:

FIG. 1a is a block diagram of an inventive register cell;

FIG. 1b is a sequence of writes with precharges in between;

FIG. 1c is a sequence of writes with discharges in between;

DESCRIPTION OF THE PREFERRED EMBODIMENTS

Figure 1:
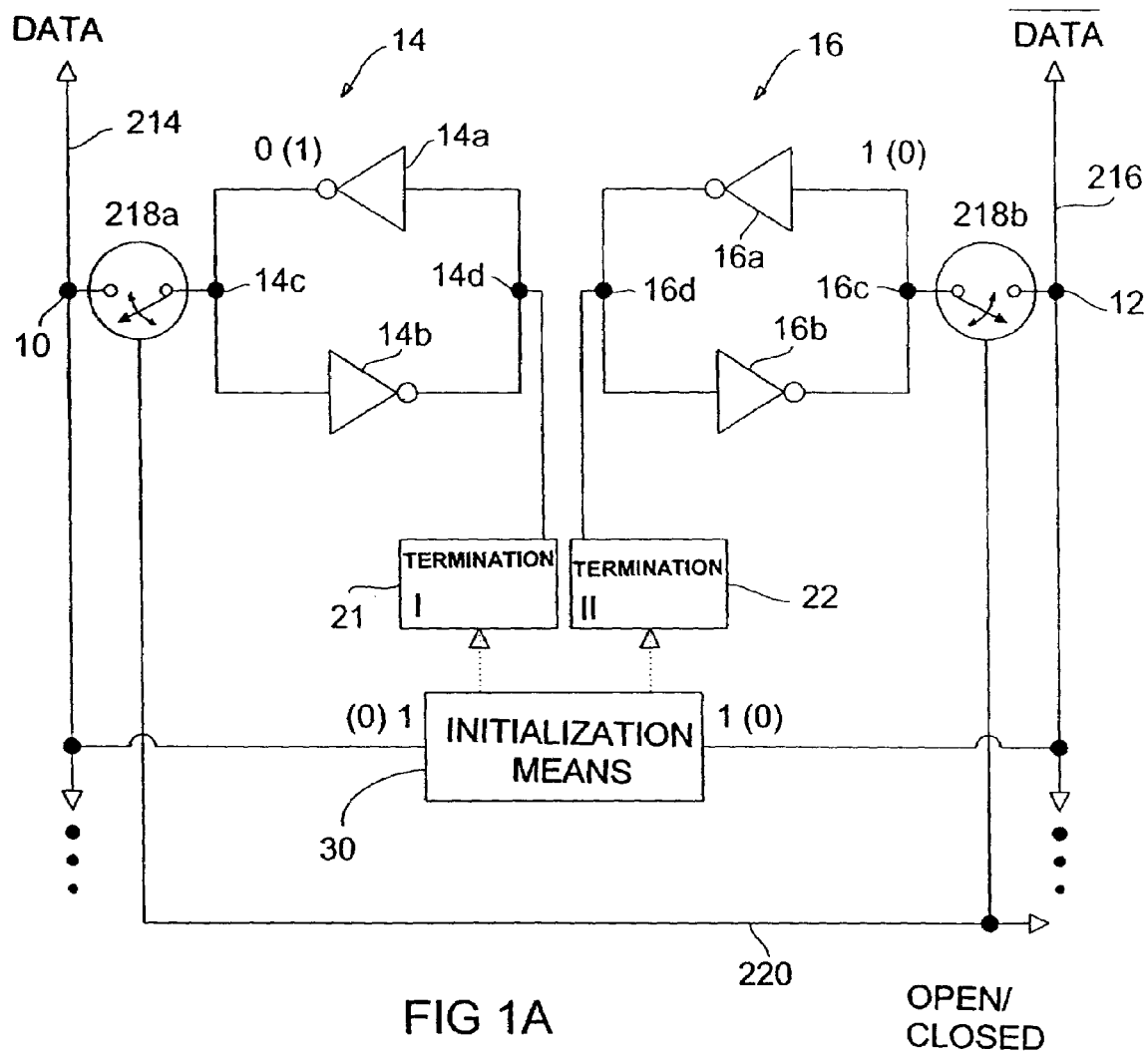

FIG. 1 shows a block diagram of an inventive safe register cell. The register cell of FIG. 1a also includes, as described in FIG. 2 for the known register cell, a line 214 for data as well as a line 216 for negated data. The coupling point of the register cell to the line 214 for the data is designated at 10 in FIG. 1a. It represents the first input of the register cell for a data unit obtained from the line 214, to be written to the register cell. A reference number 12 designates the second input of the register cell for a negated data unit to be written to the register cell. Via the one controllable switch 218, which may also be implemented as described in FIG. 2, a first pair 14 of coupled inverters is coupable to the first input 10, while, via a controllable circuit 218b, a second pair 16 of oppositely coupled inverters is coupable to the second input 12. The first pair 14 includes a first inverter 14a in addition to a second inverter 14b, which are oppositely coupable, which, in other words, means that an output of the first inverter 14a, at a linking point 14c, is connected to an input of the second inverter 14b, while the output of the second inverter 14b, at a further linking point 14d, is connected to an input of the first inverter 14a. By analogy with this, the two oppositely coupled inverters 16a, 16b of the second pair 16 are connected to each other such that a first connection point 16c is coupable to the second input 12, while a second connection point 16d connects an output of the first converter 16a to the input 16 of the second inverter 16b.

A first terminating means 21 is connected to the second connection point 14d of the first pair 14, while, by analogy with this, a second terminating means 22 is connected to the second connection point 16d of the second pair 16 of oppositely coupled inverters. In order to reach an initialization of both the data line 214 and of the line 216 for negated data, an initialization-means 30 is further provided, which either only acts upon the lines 214 and 216 or acts upon the first terminating means 21 and upon the second terminating means 22, as is shown by the dotted connecting arrows in FIG. 1a, or which acts both upon the lines 214, 216 and upon the terminating means 21, 22, to either carry out a precharge with the register cell or a discharge with the register cell.

In the following, the functionality of the storage cell shown in FIG. 1a will be described. The storage cell may comprise two conditions. It may store a logic "0". In this case a voltage state is applied to the first connection point 14c of the first pair 14 of oppositely coupled inverters 14a, 14b, which embodies the logic "0". This means automatically that, at the first connection point 16c of the second pair 16 of oppositely coupled inverters 16a, 16b, a logic "1" is applied, i.e. a voltage state which embodies the logic "1". The other possibility consists in that a logic "1" is applied to the connection point 14c, while a logic "0" is applied to the first connection point 16c of the second pair 16, as is represented in FIG. 1a by the option in brackets. If a read is to be effected from the storage cell shown in FIG. 1a, the switches 218a, 218b are opened via the control line 220, and the first pair 14 drives the line 214 for the data, while the second pair 16 drives the line 216 for the negated data in order to transmit the register condition to a receiver for the register condition.

If, by contrast, a write is to be effected to the inventive register cell, the initialization means 30 becomes active in that both the first pair 14 of the oppositely coupled inverters and the second pair 16 of the oppositely coupled inverters are initialized to the same logical state, in that either a high voltage state (precharge) or a low voltage state (discharge) is applied to the connection points 14c, 16c.

Figures 2, 3:
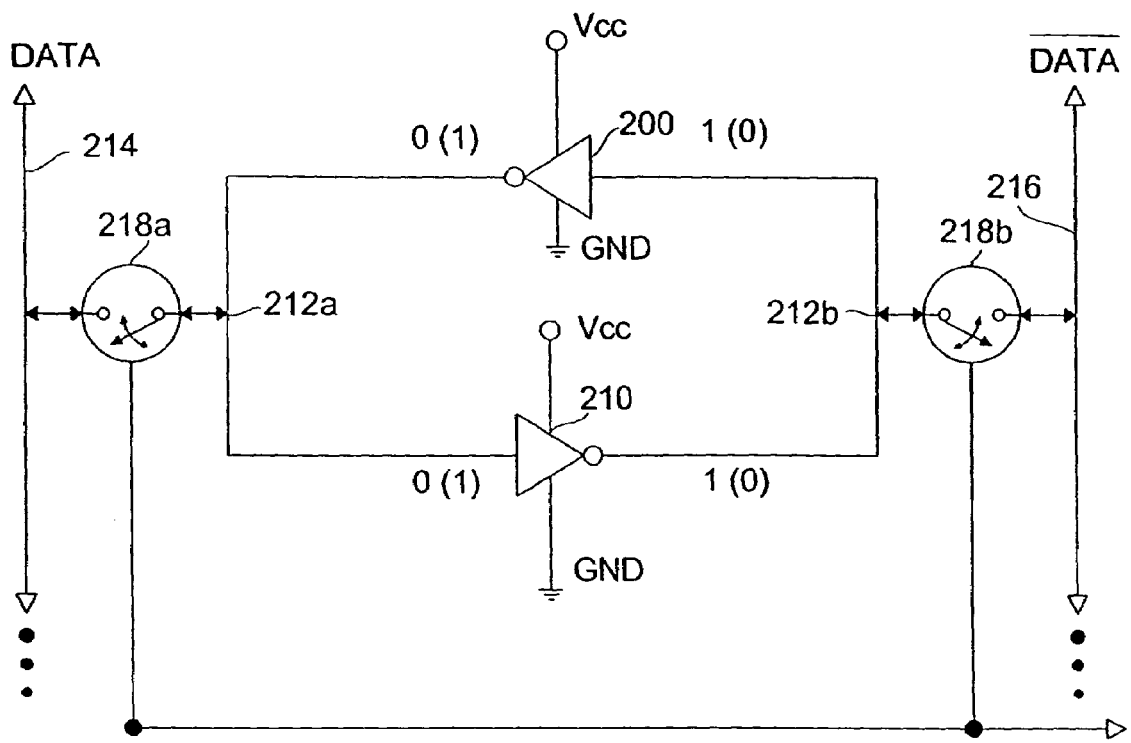
FIG. 2 is a principle block diagram of a latch-storage cell.
FIG. 3 is a time diagram of an exemplary data flow which is written into the latch-storage cell from FIG. 2.

At this point it should be appreciated that the possibility of an initialization of the two connection points 212a, 212b from FIG. 2 to the same voltage level, i. e. to the same logic state is not given, since this is just the very nature of the two inverters 200, 210 to generate the opposite logic state at their output and input, respectively, than at their input and output, respectively.

FIG. 1b shows a table of a time sequence of writes, but now with precharge cycles in between, which are designated with crosses in FIG. 1b. The data sequence is the same as is represented in FIG. 3.

FIG. 1c shows the analog case, but now with discharges in between, which are once again designated with crosses. Looking at FIGS. 1b and 1c it becomes obvious that, from one working clock to the next, it is always only either the condition of the data or the condition of the negated data that changes. It is never the case that both the condition of the data and of the negated data changes or it is never the case that the condition of the data or the condition of the negated data remains the same. Referring to the circuit shown in FIG. 1a this means that, from one working clock to the next, it is always either the condition of the first pair 14 or the condition of the second pair 16 that changes, but that it is never the case that both the condition of the first pair 14 and the condition of the second pair 16 change or that the condition of the first pair 14 and the condition of the second pair 16 never remain unchanged.

It should be appreciated the read sequences shown in FIG. 1b and FIG. 1c are merely exemplary read sequences. Thus, a safety advantage is already reached, if an initialization is not carried out before each write to the register, but if, for example, only before each second, third, . . . , nth read a register initialization with precharge or discharge is effected. It should be further appreciated that, if a corresponding agreement has been made, the intervals, in which an initialization of the register is effected, may also be irregular. It should be further appreciated that precharge and discharge may also be used in turns. Also in this case, it is always only the condition of a pair of oppositely coupled inverters from FIG. 1a that will change from one working clock to the next, but the conditions of both pairs will never change or the conditions of both pairs will never remain the same. It is thus not recognizable whether the data change or not, thus resulting in a safety advantage.

It should be appreciated that the register cell shown in FIG. 1a requires two times as many transistors as a simple register cell shown in FIG. 2. However, the number of the control switches 218a, 218b is in both cases the same. Doubling the number of transistors requires very large chip areas, especially with long number registers, which, for example, may have lengths of more than 2048 bits for certain cryptographic applications. Therefore, it is preferred to use the register cell shown in FIG. 1a only for building high-safety registers in which, in fact, sensitive data are stored, while less sensitive data are accommodated in simple registers with register cells of the implementation shown in FIG. 2. In particular, with applications for the safe register cell, for example, on a SmartCard, on which a multitude of calculations is carried out and a multitude of intermediate results to be stored in registers incur, only few data are sensitive such that they are to be stored in the complicated high-safety register with register cells of the implementation shown in FIG. 1a. If, therefore, attention is paid to the fact to accommodate only the sensitive data in complicated safety registers and to take simple registers for the remaining data, the chip area requirement, as a whole, will increase only slightly, while the gain in additional safety by special protection of the especially sensitive data is significant.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A register cell, comprising:
   a first input for a data unit to be written into the register cell;
   a second input for a negated data unit to be written into the register cell;
   a first storage circuit which is adapted to be coupled to the first input;

a second storage circuit which is adapted to be coupled to the second input; and an initializator configured to control the register cell such that the first storage circuit and the second storage circuit are initialized to a same logic state.

2. The register cell in accordance with claim 1, wherein the first storage circuit comprises a first pair of oppositely coupled inverters.

3. The register cell in accordance with claim 2, wherein the second storage circuit comprises a second pair of oppositely coupled inverters.

4. The register cell in accordance with claim 3,
wherein the first pair of oppositely coupled inverters is adapted to be coupled to the first input via a first control switch; and
wherein the second pair of oppositely coupled inverters is adapted to be coupled to the second input via a second control switch.

5. The register cell in accordance with claim 3,
wherein the inverters of the first pair and the inverters of the second pair are coupled such that an input of each inverter is coupled to an output of the other inverter of the same pair.

6. The register cell in accordance with claim 3,
wherein the first pair and the second pair of oppositely coupled inverters do not have any voltage coupling to each other.

7. The register cell in accordance with claim 3,
wherein in each of the pairs of oppositely coupled inverters a first connection node is adapted to be coupled to the associated input and a second connection node is coupled to a terminating unit, which is implemented to enable a logic state at the second connection node to be inverse to a logic state at the corresponding first connection node.

8. The register cell in accordance with claim 1,
wherein the initializator comprises a precharge means and applies a high voltage state to the first input and the second input.

9. The register cell in accordance with claim 1,
wherein the initializator comprises a discharge means and applies a low voltage state to the first input and the second input.

10. A method for writing to a register cell having a first input for a data unit to be written into the register cell, a second input for a negated data unit to be written into the register cell, a first storage circuit, which is adapted to be coupled to the first input, and a second storage circuit, which is adapted to be coupled to the second input, the method comprising the steps of:
initializing the first storage circuit and the second storage circuit to a same state;
writing the data unit via the first input to the first storage circuit; and
writing the negated data unit via the second input to the second storage circuit.

11. The method in accordance with claim 10,
wherein the state is a high voltage state.

12. The method in accordance with claim 10,
wherein the state is a low voltage state.

* * * * *